(12) United States Patent
Sasaki

(10) Patent No.: US 11,355,594 B2
(45) Date of Patent: Jun. 7, 2022

(54) DIODE

(71) Applicants: TAMURA CORPORATION, Tokyo (JP); Novel Crystal Technology, Inc., Saitama (JP)

(72) Inventor: Kohei Sasaki, Saitama (JP)

(73) Assignees: Tamura Corporation, Tokyo (JP); Novel Crystal Technology, Inc., Saitama (JP)

( * ) Notice: Subject to any disclaimer, the term of this patent is extended or adjusted under 35 U.S.C. 154(b) by 0 days.

(21) Appl. No.: 16/635,319

(22) PCT Filed: Jul. 23, 2018

(86) PCT No.: PCT/JP2018/027416
§ 371 (c)(1),
(2) Date: Jan. 30, 2020

(87) PCT Pub. No.: WO2019/031204
PCT Pub. Date: Feb. 14, 2019

(65) Prior Publication Data
US 2020/0168711 A1    May 28, 2020

(30) Foreign Application Priority Data
Aug. 10, 2017 (JP) .............................. JP2017-155768

(51) Int. Cl.
*H01L 29/66* (2006.01)
*H01L 29/24* (2006.01)
(Continued)

(52) U.S. Cl.
CPC ............ *H01L 29/247* (2013.01); *H01L 29/45* (2013.01); *H01L 29/47* (2013.01);
(Continued)

(58) Field of Classification Search
CPC combination set(s) only.
See application file for complete search history.

(56) References Cited

U.S. PATENT DOCUMENTS 7,329,915 B2   2/2008  Herman et al.
9,171,967 B2  10/2015  Takizawa et al.
(Continued)

FOREIGN PATENT DOCUMENTS

JP    2013-102081 A    5/2013
JP    2013-115114 A    6/2013
(Continued)

OTHER PUBLICATIONS

International Search Report dated Sep. 8, 2018 issued in PCT/JP2018/027416.
(Continued)

*Primary Examiner* — Moin M Rahman
(74) *Attorney, Agent, or Firm* — Scully, Scott, Murphy & Pressure, PC

(57) ABSTRACT

A diode includes an n-type semiconductor layer including an n-type $Ga_2O_3$-based single crystal, and a p-type semiconductor layer including a p-type semiconductor in which a volume of an amorphous portion is higher than a volume of a crystalline portion. The n-type semiconductor layer and the p-type semiconductor layer form a pn junction.

6 Claims, 10 Drawing Sheets

(51) Int. Cl.
*H01L 29/45* (2006.01)
*H01L 29/47* (2006.01)
*H01L 29/861* (2006.01)
*H01L 29/872* (2006.01)
*H01L 21/02* (2006.01)
*H01L 21/443* (2006.01)
*H01L 21/465* (2006.01)

(52) U.S. Cl.
CPC .... *H01L 29/66969* (2013.01); *H01L 29/8613* (2013.01); *H01L 29/872* (2013.01); *H01L 21/0243* (2013.01); *H01L 21/02414* (2013.01); *H01L 21/02565* (2013.01); *H01L 21/02592* (2013.01); *H01L 21/02631* (2013.01); *H01L 21/443* (2013.01); *H01L 21/465* (2013.01)

(56) References Cited

U.S. PATENT DOCUMENTS

| | | | |
|---|---|---|---|
| 9,412,882 B2 | 8/2016 | Takizawa et al. | |
| 9,590,050 B2 | 3/2017 | Hitora et al. | |
| 9,595,586 B2 | 3/2017 | Takizawa et al. | |
| 10,340,356 B2 | 7/2019 | Kawashima et al. | |
| 10,439,028 B2 | 10/2019 | Hitora et al. | |
| 10,566,192 B2 | 2/2020 | Lu et al. | |
| 10,777,644 B2 | 9/2020 | Kub et al. | |
| 11,069,781 B2 | 7/2021 | Hitora et al. | |
| 2007/0114528 A1 | 5/2007 | Herman et al. | |
| 2014/0217405 A1* | 8/2014 | Sasaki | H01L 29/66712 257/43 |
| 2014/0217469 A1* | 8/2014 | Sasaki | H01L 29/7824 257/192 |
| 2014/0239452 A1* | 8/2014 | Sasaki | H01L 21/02565 423/624 |
| 2014/0332823 A1 | 11/2014 | Takizawa et al. | |
| 2015/0325660 A1 | 11/2015 | Hitora et al. | |
| 2015/0349124 A1 | 12/2015 | Lu et al. | |
| 2016/0043238 A1 | 2/2016 | Takizawa et al. | |
| 2016/0322467 A1 | 11/2016 | Takizawa et al. | |
| 2017/0162655 A1 | 6/2017 | Takizawa et al. | |
| 2017/0179249 A1* | 6/2017 | Oda | H01L 21/02414 |
| 2017/0200790 A1 | 7/2017 | Hitora et al. | |
| 2018/0315820 A1 | 11/2018 | Kub et al. | |
| 2018/0358478 A1* | 12/2018 | Ren | H01L 21/0485 |
| 2019/0013389 A1 | 1/2019 | Kawashima et al. | |
| 2020/0144376 A1 | 5/2020 | Hitora et al. | |
| 2020/0295203 A1 | 9/2020 | Watahiki et al. | |
| 2021/0119000 A1 | 4/2021 | Hitora et al. | |

FOREIGN PATENT DOCUMENTS

| | | |
|---|---|---|
| JP | 2015-227279 A | 12/2015 |
| JP | 2016-025256 A | 2/2016 |
| JP | 2016-143841 A | 8/2016 |
| WO | 2016/013554 A1 | 1/2016 |
| WO | WO 2017/111173 A1 | 6/2017 |
| WO | 2018/150451 A1 | 8/2018 |

OTHER PUBLICATIONS

Kokubun, Yoshihiro et al., "All-oxide p-n heterojunction diodes comprising p-type NiO and n-type Beta-Ga2O3", Applied Physics Express 9, 091101 (2016).

Matsunami et al., "Technology of Semiconductor SiC and its Application", Second Edition, Nikkan Kogyo Shimbun, Ltd., Sep. 30, 2011, p. 355.

Ohmagari et al., "Heterojunction Diodes Comprised of n-Type Silicon and p-Type Ultrananocrystalline Diamond/Hydrogenated Amorphous Carbon Composite", Mar. 22, 2011, pp. 1-3, Japanese Journal of Applied Physics 50 (2011) 035101.

Office Action dated Aug. 17, 2021 received from the Japanese Patent Office in related application 2017-155768 together with English language translation.

Extended European Search Report dated Mar. 29, 2021 from related EP 18843602.6.

* cited by examiner

DIODE

TECHNICAL FIELD

The invention relates to a diode.

BACKGROUND ART

It is known that a p-type $Ga_2O_3$ is difficult to form. It is thus seen that a pn homojunction in $Ga_2O_3$-based diodes is difficult to form.

By the way, it is known that an n-type $\beta$-$Ga_2O_3$ single crystal forms a pn heterojunction with a p-type NiO single crystal (see, e.g., Non-Patent Literature 1). Non-Patent Literature 1 discloses a pn junction diode which utilize the rectification property of a pn heterojunction formed between the n-type $\beta$-$Ga_2O_3$ single crystal and the p-type NiO single crystal.

Also, a Schottky barrier diode is known which has a guard ring structure or a junction barrier Schottky structure utilizing a pn heterojunction between an n-type $\alpha$-$Ga_2O_3$ crystal and an inorganic compound crystal with a p-type hexagonal crystal structure (see, e.g., Patent Literature 1).

CITATION LIST

Patent Literature

Patent Literature 1: JP 2016/25256 A

Non-Patent Literature

Non-Patent Literature 1: Yoshihiro Kokubun et al., "All-oxide p-n heterojunction diodes comprising p-type NiO and n-type $\beta$-$Ga_2O_3$", Applied Physics Express 9, 091101 (2016)

SUMMARY OF INVENTION

Technical Problem

It is an object of the invention to provide a $Ga_2O_3$-based diode utilizing a pn heterojunction, which can be easily produced at low cost.

Solution to Problem

To achieve the above-mentioned object, an aspect of the invention provides a diode described in [1] to [6] below.

[1] A diode, comprising an n-type semiconductor layer comprising an n-type $Ga_2O_3$-based single crystal and a p-type semiconductor layer comprising a p-type semiconductor in which a volume of an amorphous portion is higher than a volume of a crystalline portion, wherein the n-type semiconductor layer and the p-type semiconductor layer form a pn junction.

[2] The diode according to [1], wherein the p-type semiconductor comprises NiO.

[3] The diode according to [1] or [2], comprising a pn junction diode that utilizes a rectification property of the pn junction.

[4] The diode according to [1] or [2], wherein the diode comprises a Schottky barrier diode that comprises an anode electrode that forms a Schottky junction with the n-type semiconductor layer to utilize the rectification property of the Schottky junction.

[5] The diode according to [4], further comprising a trench junction barrier Schottky structure or a guard ring structure.

[6] The diode according to [4] or [5], wherein a portion of the anode electrode in contact with the n-type semiconductor layer comprises Fe, Cu, Mo or W.

Advantageous Effects of Invention

According to the invention, a $Ga_2O_3$-based diode utilizing a pn heterojunction, which can be easily produced at low cost, can be provided.

DESCRIPTION OF EMBODIMENTS

In semiconductor elements provided with an insulating film such as gate insulating film on a semiconductor, leakage current is smaller when the insulating film is amorphous than when crystalline Inspired by this, the present inventor used a p-type semiconductor film, in which the volume of amorphous portion is higher than the volume of crystalline portion, as a p-type semiconductor film forming a pn hetero junction with a $Ga_2O_3$-based semiconductor layer, and the present invention was made.

Specific examples of semiconductor elements utilizing a pn heterojunction between a $Ga_2O_3$-based semiconductor layer and a p-type semiconductor film in which the volume of amorphous portion is higher than the volume of crystalline portion will be described below.

First Embodiment

Configuration of the pn Junction Diode

Figure 1:
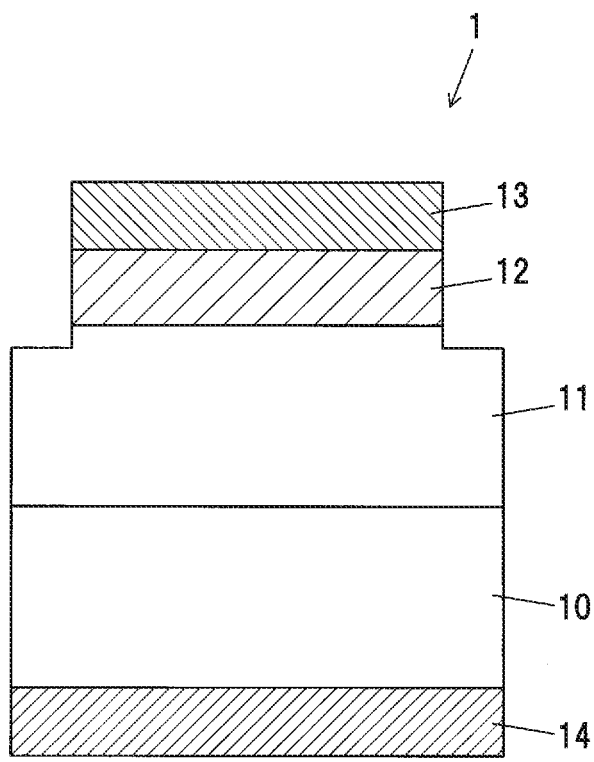
FIG. 1 is a vertical cross-sectional view showing a pn junction diode in the first embodiment.

FIG. 1 is a vertical cross-sectional view showing a pn junction diode 1 in the first embodiment. The pn junction diode 1 is provided with an n-type semiconductor substrate 10, an n-type semiconductor layer 11 formed on the n-type semiconductor substrate 10, a p-type semiconductor layer 12 formed on a surface of the n-type semiconductor layer 11 opposite to the n-type semiconductor substrate 10, an anode electrode 13 formed on a surface of the p-type semiconductor layer 12 opposite to the n-type semiconductor layer 11, and a cathode electrode 14 formed on a surface of the n-type semiconductor substrate 10 opposite to the n-type semiconductor layer 11.

The n-type semiconductor layer 11 and the p-type semiconductor layer 12 form a pn junction, and the pn junction diode 1 utilizes the rectification property of the pn junction.

In the pn junction diode 1, a potential barrier at an interface between the p-type semiconductor layer 12 and the n-type semiconductor layer 11 as viewed from the n-type semiconductor layer 11 is lowered by applying forward voltage between the anode electrode 13 and the cathode electrode 14 (positive potential on the anode electrode 13 side), allowing a current to flow from the anode electrode 13 to the cathode electrode 14. On the other hand, when reverse voltage is applied between the anode electrode 13 and the cathode electrode 14 (negative potential on the anode electrode 13 side), the current does not flow due to the potential barrier between pn.

The n-type semiconductor substrate 10 is a substrate formed of an n-type $Ga_2O_3$-based single crystal. The n-type semiconductor substrate 10 contains a donor impurity such as Si or Sn. The donor concentration in the n-type semiconductor substrate 10 is, e.g., not less than $1.0 \times 10^{18}$ cm$^{-3}$ and not more than $1.0 \times 10^{20}$ cm$^{-3}$. The thickness of the n-type semiconductor substrate 10 is, e.g., not less than 10 μm and not more than 600 μm.

The $Ga_2O_3$-based single crystal here means a $Ga_2O_3$ single crystal or is a $Ga_2O_3$ single crystal doped with an element such as Al or In, and may be, e.g., a $(Ga_xAl_yIn_{(1-x-y)})_2O_3$ ($0 < x \leq 1$, $0 \leq y < 1$, $0 < x+y \leq 1$) single crystal which is a $Ga_2O_3$ single crystal doped with Al and In. The band gap is widened by adding Al and is narrowed by adding In. The $Ga_2O_3$ single crystal mentioned above has, e.g., a O-crystal structure.

The n-type semiconductor layer 11 is formed of an n-type $Ga_2O_3$-based single crystal. The n-type semiconductor layer 11 contains a donor impurity such as Si or Sn. The donor concentration in the n-type semiconductor layer 11 is, e.g., not less than $1 \times 10^{13}$ cm$^{-3}$ and not more than $1 \times 10^{18}$ cm$^{-3}$. The thickness of the n-type semiconductor layer 11 is, e.g., not less than 1 μm and not more than 100 μm.

The p-type semiconductor layer 12 is formed of a p-type semiconductor in which the volume of amorphous portion is higher than the volume of crystalline portion. As the p-type semiconductor, it is possible to use, e.g., NiO, SnO or $Cu_2O$. NiO, SnO and $Cu_2O$ exhibit p-type conductivity without being doped with any dopant, but may contain an acceptor impurity such as Li.

Among NiO, SnO and $Cu_2O$, NiO is the most preferable material for the p-type semiconductor layer 12 since NiO is thermodynamically stable and allows p-type layers to be stably obtained. It is difficult to form SnO due to the existence of $Sn_2O$ which is thermodynamically more stable than SnO. In this regard, the conductivity of $Sn_2O$ is unstable and it is difficult to control to be p-type. The conductivity of $Cu_2O$ is also unstable and it is difficult to control to be p-type.

A p-type semiconductor film containing an amorphous portion can be formed at a lower temperature than an entirely crystalline p-type semiconductor film, and thus can be manufactured easier at lower cost. In addition, by using the p-type semiconductor film containing an amorphous portion as the p-type semiconductor layer 12, occurrence of leakage current can be suppressed as compared to when using the entirely crystalline p-type semiconductor film.

The anode electrode 13 is formed of a conductive material such as Ni forming an ohmic junction with the p-type semiconductor layer 12. The thickness of the anode electrode 13 is, e.g., not less than 0.03 μm and not more than 5 μm.

The cathode electrode 14 is configured so that a portion in contact with the n-type semiconductor substrate 10 is formed of a conductive material such as Ti forming an ohmic junction with $Ga_2O_3$-based single crystal. That is, the cathode electrode 14 when having a single layer structure is entirely formed of Ti, etc., and the cathode electrode 14 when having a multilayer structure is configured so that a layer in contact with the n-type semiconductor substrate 10 is formed of Ti, etc. Examples of the multilayer structure of the cathode electrode 14 include Ti/Au and Ti/Al. The thickness of the cathode electrode 14 is, e.g., not less than 0.03 μm and not more than 5 μm.

(Method for Manufacturing the pn Junction Diode)

An example of a method for manufacturing the pn junction diode 1 will be described below.

Firstly, a $Ga_2O_3$-based single crystal containing a donor is epitaxially grown on the n-type semiconductor substrate 10 by the HYPE (Hydride Vapor Phase Epitaxy) method, etc., thereby forming the n-type semiconductor layer 11.

The n-type semiconductor substrate 10 is a substrate obtained by, e.g., slicing a bulk crystal of a $Ga_2O_3$-based single crystal containing a donor and grown using a melt-growth technique such as the FZ (Floating Zone) method or the EFG (Edge Defined Film Fed Growth) method and then polishing the surface of the sliced crystal.

Next, a p-type semiconductor in which the volume of amorphous portion is higher than the volume of crystalline portion is deposited on the n-type semiconductor layer 11 by radio-frequency (RF) sputtering, etc., thereby forming the p-type semiconductor layer 12.

The preferable conditions when forming the p-type semiconductor layer 12 by radio-frequency sputtering are substrate temperature (deposition temperature) of not less than 25° C. and not more than 700° C., plasma output of not less than 50 W and not more than 300 W, pressure of not less than 0.1 Pa and not more than 1 Pa, $O_2$ as gas species, gas flow rate of not less than 0.1 sccm and not more than 100 sccm, and deposition time of not less than 0.1 hour and not more than 10 hours. When forming the p-type semiconductor layer 12 made of NiO, the sputtering target is preferably formed of, e.g., NiO or Ni.

Although crystallinity of the p-type semiconductor layer 12 is considered to be affected by some parameters such as substrate temperature or orientation of base crystal, it is easy to form the p-type semiconductor layer 12 in which the volume of amorphous portion is higher than the volume of crystalline portion when the substrate temperature is not more than 700° C.

Next, the anode electrode 13 and the cathode electrode 14 are respectively formed on the front surface of the p-type semiconductor layer 12 and the back surface of the n-type semiconductor substrate 10 by vacuum deposition, etc.

As shown in FIG. 1, a portion of the n-type semiconductor layer 11 on the upper side, the p-type semiconductor layer 12 and the anode electrode 13 may be patterned into a mesa shape by photoetching, etc. By patterning into a mesa shape, it is possible to suppress particularly leakage current laterally flowing in the p-type semiconductor layer 12.

Second Embodiment (Configuration of Junction Barrier Schottky Diode)

Figure 2:
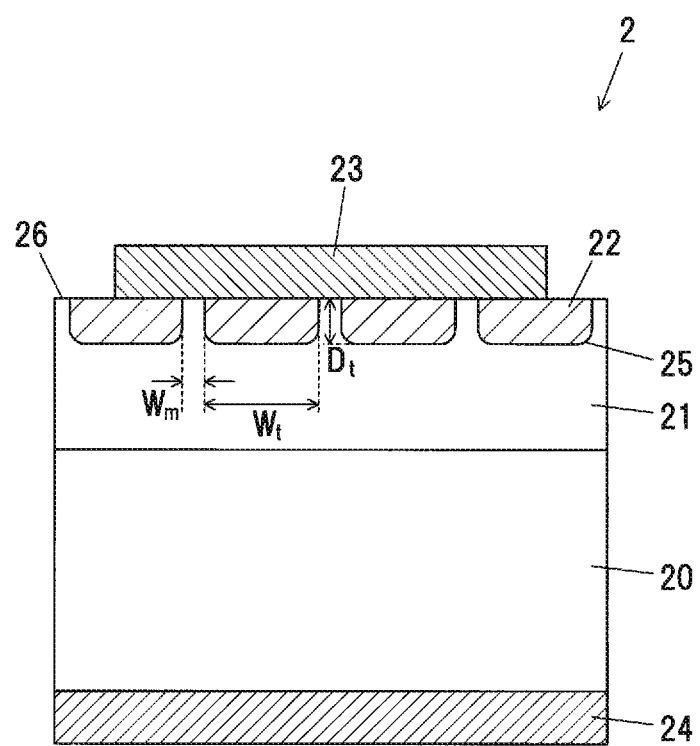
FIG. 2 is a vertical cross-sectional view showing a trench junction barrier Schottky (JBS) diode 2 in the second embodiment.

FIG. 2 is a vertical cross-sectional view showing a trench junction barrier Schottky (JBS) diode 2 in the second embodiment. The trench JBS diode 2 is a vertical Schottky barrier diode having a trench junction barrier Schottky (JBS) structure.

The trench JBS diode 2 is provided with an n-type semiconductor substrate 20, an n-type semiconductor layer 21 formed on the n-type semiconductor substrate 20 and having trenches 25 opening on a surface 26 opposite to the n-type semiconductor substrate 20, p-type semiconductor layers 22 buried in the trenches 25 of the n-type semiconductor layer 21, an anode electrode 23 formed on the surface 26 of the n-type semiconductor layer 21 so as to be in contact with the p-type semiconductor layers 22, and a cathode electrode 24 formed on a surface of the n-type semiconductor substrate 20 opposite to the n-type semiconductor layer 21.

The n-type semiconductor layer 21 and the anode electrode 23 form a Schottky junction, and the trench JBS diode 2 utilizes the rectification property of the Schottky junction.

In the trench JBS diode 2, a potential barrier at an interface between the anode electrode 23 and the n-type semiconductor layer 21 as viewed from the n-type semiconductor layer 21 is lowered by applying forward voltage between the anode electrode 23 and the cathode electrode 24 (positive potential on the anode electrode 23 side), allowing a current to flow from the anode electrode 23 to the cathode electrode 24.

On the other hand, when reverse voltage is applied between the anode electrode 23 and the cathode electrode 24 (negative potential on the anode electrode 23 side), the current does not flow due to the Schottky barrier. At this time, since depletion layers spread from the p-type semiconductor layers 22 and close channels, leakage current is efficiently suppressed.

In general, the upper limit of reverse leakage current in Schottky barrier diode is 1 μA. In the second embodiment, reverse voltage when a leakage current of 1 μA flows is defined as withstand voltage.

According to data of dependence of reverse leakage current on electric field strength at Schottky interface in Schottky barrier diode having a SiC semiconductor layer described in, e.g., "Technology of Semiconductor SiC and its Application" by Hiroyuki Matsunami, Noboru Otani, Tsunenobu Kimoto and Takashi Nakamura, Second Edition, Nikkan Kogyo Shimbun, Ltd., Sep. 30, 2011, p. 355, electric field strength immediately under Schottky electrode is about 0.8 MV/cm when a current density of reverse leakage current is 0.0001 A/cm². 0.0001 A/cm² here is a current density immediately under the Schottky electrode when a current of 1 μA flows through the Schottky electrode having a size of 1 mm×1 mm.

Thus, even when breakdown field strength of the semiconductor material itself is several MV/cm, a leakage current of more than 1 μA flows when the electric field strength immediately under the Schottky electrode exceeds 0.8 MV/cm.

In order to obtain withstand voltage of 1200V in, e.g., a conventional Schottky barrier diode not having a special structure to reduce electric field strength immediately under Schottky electrode, a donor concentration in a semiconductor layer needs to be reduced to the order of $10^{15}$ cm$^{-3}$ and also the semiconductor layer needs to be very thick so that the electric field strength immediately under the Schottky electrode is kept not more than 0.8 MV/cm. This causes a significant increase in conduction loss, and it is thus difficult to make a Schottky barrier diode having a high withstand voltage and low loss.

The trench JBS diode 2 in the second embodiment has a trench JBS structure and thus can have a high withstand voltage without an increase in resistance of the semiconductor layer. In other words, the trench JBS diode 2 is a Schottky barrier diode having a high withstand voltage and low loss.

The n-type semiconductor substrate 20 is formed of an n-type $Ga_2O_3$-based single crystal containing a Group IV element, such as Si or Sn, as a donor. The donor concentration in the n-type semiconductor substrate 20 is, e.g., not less than $1.0 \times 10^{18}$ cm$^{-3}$ and not more than $1.0 \times 10^{20}$ cm$^{-3}$. The thickness of the n-type semiconductor substrate 20 is, e.g., not less than 10 μm and not more than 600 μm.

The n-type semiconductor layer 21 is formed of an n-type $Ga_2O_3$-based single crystal containing a Group IV element, such as Si or Sn, as a donor. The donor concentration in the n-type semiconductor layer 21 is lower than the donor concentration in the n-type semiconductor substrate 20.

A high-donor-concentration layer containing a high concentration of donor may be additionally formed between the n-type semiconductor substrate 20 and the n-type semiconductor layer 21. In other words, the n-type semiconductor layer 21 may be stacked on the n-type semiconductor substrate 20 via the high-donor-concentration layer. At the early growth stage of the n-type semiconductor layer 21, the amount of dopant incorporated thereinto is unstable and an acceptor impurity is diffused from the n-type semiconductor substrate 20. Thus, in some cases, resistance increases in a region of the n-type semiconductor layer 21 close to the interface with the n-type semiconductor substrate 20 when the n-type semiconductor layer 21 is grown directly on the n-type semiconductor substrate 20. The high-donor-concentration layer is used to avoid such problems. The concentration in the high-donor-concentration layer is set to be, e.g., higher than the concentration in the n-type semiconductor layer 21, more preferably, higher than the concentration in the n-type semiconductor substrate 20.

As the donor concentration in the n-type semiconductor layer 21 increases, electrical field strength in each part of the trench JBS diode 2 increases. The donor concentration in the n-type semiconductor layer 21 is preferably not more than about $2.0 \times 10^{17}$ cm$^{-3}$ to lower the maximum electric field strength in a region of the n-type semiconductor layer 21 immediately under the anode electrode 23 and the maximum electric field strength in the n-type semiconductor layer 21.

On the other hand, as the donor concentration decreases, resistance of the n-type semiconductor layer 21 increases and the forward loss increases. Therefore, to obtain withstand voltage of, e.g., not more than 1200V, the donor concentration is preferably not less than $3.0 \times 10^{16}$ cm$^{-3}$. To obtain higher withstand voltage, the donor concentration may be reduced to, e.g., about $1.0 \times 10^{16}$ cm$^{-3}$.

As the thickness of the n-type semiconductor layer 21 increases, the maximum electric field strength in the n-type semiconductor layer 21 decreases. By adjusting the thickness of the n-type semiconductor layer 21 to not less than about 3 µm, it is possible to effectively reduce the maximum electric field strength in the-type semiconductor layer 21. In view of reduction in these maximum electric field strengths and downsizing of the trench JBS diode 2, the thickness of the n-type semiconductor layer 21 is preferably about not less than 3 µm and not more than 9 µm.

Electrical field strength in each part of the trench JBS diode 2 changes depending on a depth $D_t$ of the trenches 25. The depth $D_t$ of the trenches 25 is preferably about not less than 1.5 µm and not more than 6 µm to lower the maximum electric field strength in a region of the n-type semiconductor layer 21 immediately under the anode electrode 23 and the maximum electric field strength in the n-type semiconductor layer 21.

When a width $W_t$ of the trenches 25 is narrower, the conduction loss can be more reduced but it is more difficult to manufacture, causing a decrease in production yield. Therefore, the width $W_t$ is preferably not less than 0.3 µm and not more than 5 µm.

As a width $W_m$ of a mesa-shaped portion between adjacent trenches 25 on the n-type semiconductor layer 21 decreases, the maximum electric field strength in a region of the n-type semiconductor layer 21 immediately under the anode electrode 23 decreases. The width $W_m$ of the mesa-shaped portion is preferably not more than 5 µm to lower the maximum electric field strength in a region of the n-type semiconductor layer 21 immediately under the anode electrode 23. At the same time, the width $W_m$ of the mesa-shaped portion is preferably not less than 0.25 µm since it is more difficult to make the trenches 25 when the width of the mesa-shaped portion is smaller.

The p-type semiconductor layer 22 is formed of a p-type semiconductor in which the volume of amorphous portion is higher than the volume of crystalline portion. As the p-type semiconductor, it is possible to use, e.g., NiO, SnO or Cu$_2$O. NiO, SnO and Cu$_2$O exhibit p-type conductivity without being doped with any dopant, but may contain an acceptor impurity such as Li.

Among NiO, SnO and Cu$_2$O, NiO is the most preferable material for the p-type semiconductor layer 22 since NiO is thermodynamically stable and allows p-type layers to be stably obtained. It is difficult to form SnO due to the existence of Sn$_2$O which is thermodynamically more stable than SnO. In this regard, the conductivity of Sn$_2$O is unstable and it is difficult to control to be p-type. The conductivity of Cu$_2$O is also unstable and it is difficult to control to be p-type.

A p-type semiconductor film containing an amorphous portion can be manufactured easier at lower cost than an entirely crystalline p-type semiconductor film. Particularly, it is difficult to bury the crystalline p-type semiconductor film since surfaces of the Ga$_2$O$_3$-based single crystal with various orientations are exposed on the inner surfaces of the trenches 25, but it is relatively easy to bury the p-type semiconductor film containing an amorphous portion. In addition, by using the p-type semiconductor film containing an amorphous portion as the p-type semiconductor layer 22, leakage current can be suppressed as compared to when using the entirely crystalline p-type semiconductor film.

The anode electrode 23 is configured so that a portion in contact with the n-type semiconductor layer 21 is formed of a material to be in Schottky contact with the n-type semiconductor layer 21. In detail, the anode electrode 23 when having a single layer structure is entirely formed of a material to be in Schottky contact with the n-type semiconductor layer 21, and the anode electrode 23 when having a multilayer structure is configured so that at least a layer in contact with the n-type semiconductor layer 21 is formed of a material to be in Schottky contact with the n-type semiconductor layer 21.

To reduce the turn-on voltage of the trench JBS diode 2, a portion of the anode electrode 23 in contact with the n-type semiconductor layer 21 is preferably formed of Fe (iron), Cu (copper), Mo (molybdenum) or W (tungsten).

When the portion of the anode electrode 23 in contact with the n-type semiconductor layer 21 is formed of Mo or W, the turn-on voltage of the trench JBS diode 2 is not less than 0.4V and not more than 0.6V. When the portion of the anode electrode 23 in contact with the n-type semiconductor layer 21 is formed of Fe, the turn-on voltage of the trench JBS diode 2 is not less than 0.4V and not more than 0.7V. When the portion of the anode electrode 23 in contact with the n-type semiconductor layer 21 is formed of Cu, the turn-on voltage of the trench JBS diode 2 is not less than 0.6V and not more than 0.9V.

In the trench JBS diode 2, a potential barrier is formed in the mesa-shaped portion. Thus, the turn-on voltage depends on the width $W_m$ of the mesa-shaped portion and increases as the width $W_m$ decreases.

The electric field strength in the trench JBS diode 2 is affected by the width $W_m$ of the mesa-shaped portion between two adjacent trenches 25 and the depth $D_t$ of the trenches 25, etc., as described above but is hardly affected by the planar pattern of the trenches 25 (the planar pattern of the p-type semiconductor layers 22). Therefore, the planar pattern of the trenches 25 on the n-type semiconductor layer 21 (the planar pattern of the p-type semiconductor layers 22) is not specifically limited.

The cathode electrode 24 is in in ohmic contact with the n-type semiconductor substrate 20. The cathode electrode 24 is formed of a metal such as Ti. The cathode electrode 24 may have a multilayer structure formed by stacking different metal films, e.g., Ti/Au or Ti/Al. For reliable ohmic contact between the cathode electrode 24 and the n-type semiconductor substrate 20, the cathode electrode 24 is preferably configured such that a layer in contact with the n-type semiconductor substrate 20 is formed of Ti.

(Method for Manufacturing the Trench JBS Diode)

An example of a method for manufacturing the trench JBS diode 2 will be described below.

FIGS. 3A to 3C and 4A to 4C are vertical cross-sectional views showing a process of manufacturing the trench JBS diode 2 in the second embodiment.

Figure 3A:
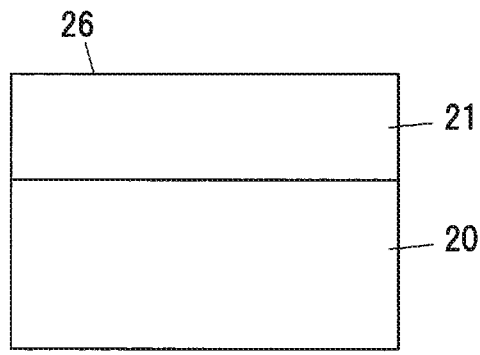
FIG. 3A is a vertical cross-sectional view showing a process of manufacturing the trench JBS diode in the second embodiment.

Firstly, as shown in FIG. 3A, a Ga$_2$O$_3$-based single crystal containing a donor such as Si is epitaxially grown on the n-type semiconductor substrate 20 by the HYPE method, etc., thereby forming the n-type semiconductor layer 21.

The n-type semiconductor substrate 20 is a substrate obtained by, e.g., slicing a bulk crystal of a Ga$_2$O$_3$-based single crystal containing a donor and grown using a melt-growth technique such as the FZ method or the EFG method and then polishing the surface of the sliced crystal.

Figure 3B:
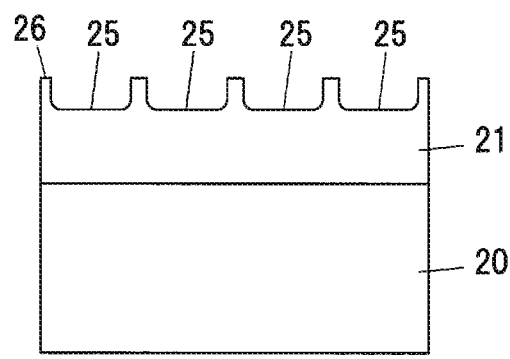
FIG. 3B is a vertical cross-sectional view showing the process of manufacturing the trench JBS diode in the second embodiment.

Next, as shown in FIG. 3B, the trenches 25 are formed on the surface 26 of the n-type semiconductor layer 21 on the opposite side to the n-type semiconductor substrate 20 by photolithography and dry etching, etc.

In case that dry etching is used to form the trenches 25, the preferable conditions are, e.g., use of $BCl_3$ (30 sccm) as an etching gas, pressure of 1.0 Pa, antenna power of 160 W, bias power of 17 W, and duration of 90 minutes.

In addition, treatment with phosphoric acid is preferably performed after forming the trenches 25 to remove roughness or plasma damage on the inner surfaces of the trenches 25. Typically, immersion in phosphoric acid heated to 130 to 140° C. for 1 to 30 minutes is preferable.

Figure 3C:
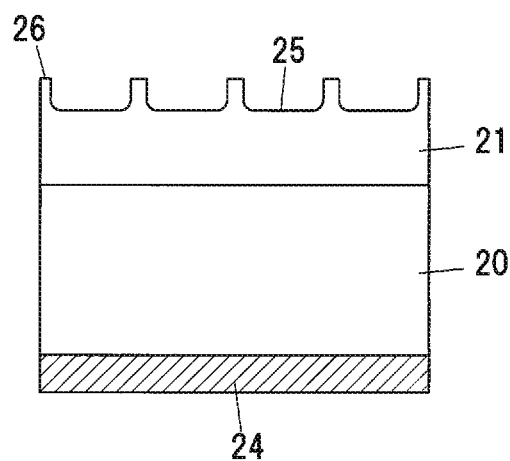
FIG. 3C is a vertical cross-sectional view showing the process of manufacturing the trench JBS diode in the second embodiment.

Next, as shown in FIG. 3C, the cathode electrode 24 having a Ti/Au stacked structure, etc., is formed on the bottom surface of the n-type semiconductor substrate 20 by electron beam evaporation, etc. After that, heat treatment is performed in a nitrogen atmosphere at 450° C. for 1 minute. This heat treatment reduces contact resistance between the cathode electrode 24 and the n-type semiconductor substrate 20.

Figure 4A:
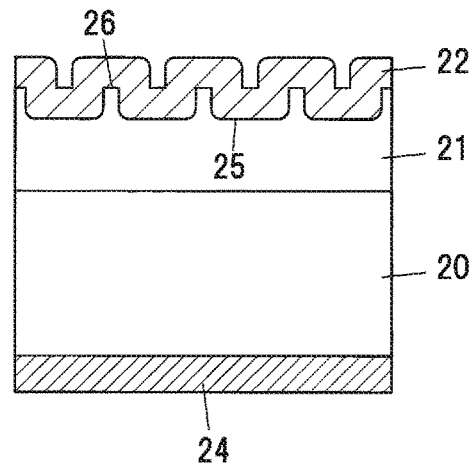
FIG. 4A is a vertical cross-sectional view showing the process of manufacturing the trench JBS diode in the second embodiment.

Next, as shown in FIG. 4A, a p-type semiconductor film with a thickness enough to fill the trenches 25 is deposited on the entire surface 26 of the n-type semiconductor layer 21 by radio-frequency sputtering, etc.

The preferable conditions when forming the p-type semiconductor layer 22 by radio-frequency sputtering are substrate temperature (deposition temperature) of not less than 25° C. and not more than 700° C., plasma output of not less than 50 W and not more than 300 W, pressure of not less than 0.1 Pa and not more than 1 Pa, $O_2$ as gas species, gas flow rate of not less than 0.1 sccm and not more than 100 sccm, and deposition time of not less than 0.1 hour and not more than 10 hours. When forming the p-type semiconductor layer 22 made of NiO, the sputtering target is preferably formed of, e.g., NiO or Ni.

Although crystallinity of the p-type semiconductor layer 22 is considered to be affected by some parameters such as substrate temperature or orientation of base crystal, it is easy to form the p-type semiconductor layer 22 in which the volume of amorphous portion is higher than the volume of crystalline portion when the substrate temperature is not more than 700° C.

Figure 4B:
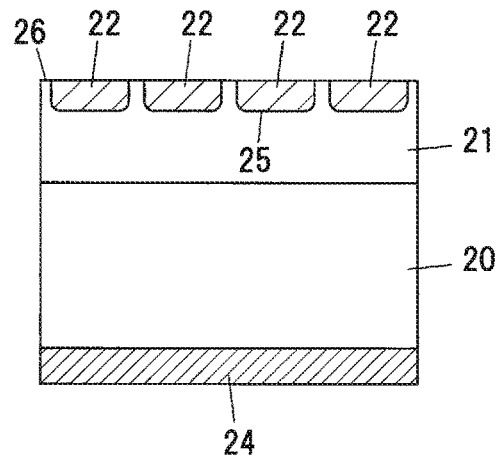
FIG. 4B is a vertical cross-sectional view showing the process of manufacturing the trench JBS diode in the second embodiment.

Next, as shown in FIG. 4B, the surface 26 is exposed by removing part of the deposited p-type semiconductor film outside the trenches 25 (portions above the level of the surface 26) by a planarization process such as CMP (Chemical Mechanical Polishing). The p-type semiconductor layers 22 are thereby buried in the trenches 25.

After that, the surface 26 of the n-type semiconductor layer 21 is pre-treated with a treatment solution containing hydrogen peroxide, such as hydrogen peroxide solution, before forming the anode electrode 23. In case that a treatment solution not containing hydrogen peroxide, such as hydrochloric acid, nitric acid, sulfuric acid, hydrofluoric acid or buffered hydrofluoric acid, is used, treatment with the treatment solution containing hydrogen peroxide is performed after treatment with the those solutions. If treatment with the treatment solution containing hydrogen peroxide is not performed at the end of the pre-treatment, it could cause the turn-on voltage of the trench JBS diode 2 to be fixed to about 0.8V to 1.0V, regardless of the material of the anode electrode 23.

Besides the hydrogen peroxide solution, e.g., a solution obtained by adding appropriate amounts of hydrogen peroxide and water to an inorganic acid such as hydrochloric acid, nitric acid or sulfuric acid can be used as the treatment solution containing hydrogen peroxide. When using, e.g., a sulfuric acid/hydrogen peroxide mixture which is obtained by adding a hydrogen peroxide and water to a sulfuric acid, it is possible to use a sulfuric acid/hydrogen peroxide mixture containing sulfuric acid, hydrogen peroxide and water with a volume ratio of 4:1:1 to 4:1:1000.

Figure 4C:
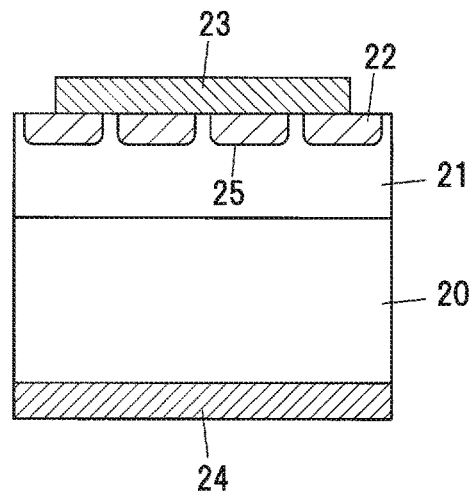
FIG. 4C is a vertical cross-sectional view showing the process of manufacturing the trench JBS diode in the second embodiment.

Next, as shown in FIG. 4C, the anode electrode 23 having a Mo/Au stacked structure, etc., is formed on the surface 26 of the n-type semiconductor layer 21 by electron beam evaporation, etc. The anode electrode 23 may be patterned into a predetermined pattern such as a circle by lift-off, etc.

Third Embodiment (Configuration of Schottky Barrier Diode)

Figure 5:
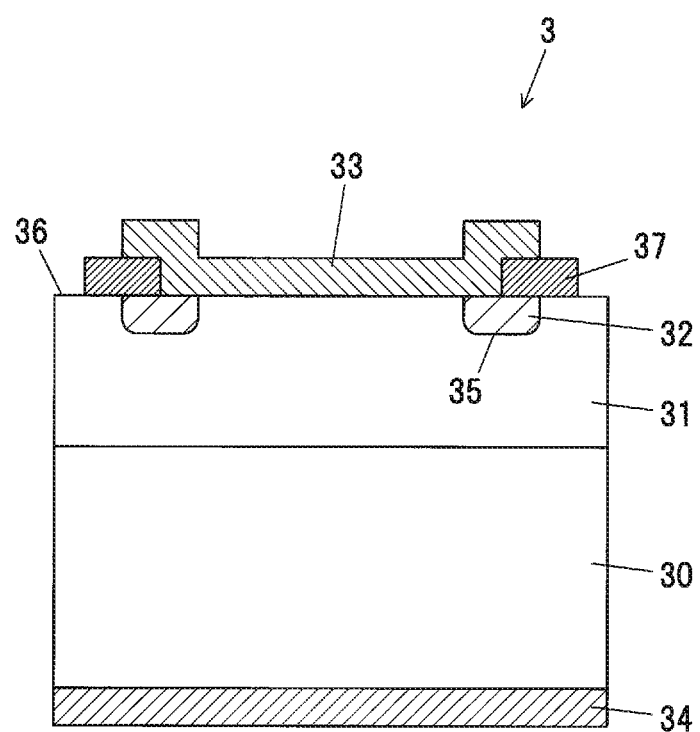
FIG. 5 is a vertical cross-sectional view showing a Schottky barrier diode in the third embodiment.

FIG. 5 is a vertical cross-sectional view showing a Schottky barrier diode 3 in the third embodiment. The Schottky barrier diode 3 is a vertical Schottky barrier diode having a guard ring structure.

The Schottky barrier diode 3 is provided with an n-type semiconductor substrate 30, an n-type semiconductor layer 31 formed on the n-type semiconductor substrate 30 and having trenches 35 opening on a surface 36 opposite to the n-type semiconductor substrate 30, a p-type semiconductor layer 32 as a guard ring buried in the trenches 35 of the n-type semiconductor layer 31, an anode electrode 33 formed on the surface 36 of the n-type semiconductor layer 31, and a cathode electrode 34 formed on a surface of the n-type semiconductor substrate 30 opposite to the n-type semiconductor layer 31.

The p-type semiconductor layer 32 as a guard ring is formed in a region partially overlapping the anode electrode 33, can reduce concentration of the electric field at an edge portion of the anode electrode 33, and can improve withstand voltage of the Schottky barrier diode 3.

The Schottky barrier diode 3 has also a dielectric film 37 formed of a dielectric material such as $SiO_2$ on the surface 36 of the n-type semiconductor layer 31 so as to be located around the anode electrode 33, and is configured such that the edge of the anode electrode 33 rides over the dielectric film 37. This field-plate structure also can reduce concentration of the electric field at the edge portion of the anode electrode 33 and can improve withstand voltage of the Schottky barrier diode 3.

The n-type semiconductor layer 31 and the anode electrode 33 form a Schottky junction, and the Schottky barrier diode 3 utilizes the rectification property of the Schottky junction.

In the Schottky barrier diode 3, a potential barrier at an interface between the anode electrode 33 and the n-type semiconductor layer 31 as viewed from the n-type semiconductor layer 31 is lowered by applying forward voltage between the anode electrode 33 and the cathode electrode 34 (positive potential on the anode electrode 33 side), allowing a current to flow from the anode electrode 33 to the cathode electrode 34.

On the other hand, when reverse voltage is applied between the anode electrode 33 and the cathode electrode 34 (negative potential on the anode electrode 33 side), the current does not flow due to the Schottky barrier. At this time, due to the guard ring structure and the field-plate structure, concentration of the electric field at the edge portion of the anode electrode 33 is reduced and leakage current is thus suppressed.

The n-type semiconductor substrate 30 is formed of an n-type $Ga_2O_3$-based single crystal containing a Group IV element, such as Si or Sn, as a donor. The donor concentration in the n-type semiconductor substrate 30 is, e.g., not less than $1.0 \times 10^{18}$ cm$^{-3}$ and not more than $1.0 \times 10^{20}$ cm$^{-3}$. The thickness of the n-type semiconductor substrate 30 is, e.g., not less than 10 µm and not more than 600 µm.

The n-type semiconductor layer 31 is formed of an n-type Ga$_2$O$_3$-based single crystal containing a Group IV element, such as Si or Sn, as a donor. The donor concentration in the n-type semiconductor layer 31 is lower than the donor concentration in the n-type semiconductor substrate 30.

A high-donor-concentration layer containing a high concentration of donor may be additionally formed between the n-type semiconductor substrate 30 and the n-type semiconductor layer 31. In other words, the n-type semiconductor layer 31 may be stacked on the n-type semiconductor substrate 30 via the high-donor-concentration layer. The concentration in the high-donor-concentration layer is set to be, e.g., higher than the concentration in the n-type semiconductor layer 31, more preferably, higher than the concentration in the n-type semiconductor substrate 30.

As the donor concentration in the n-type semiconductor layer 31 increases, electrical field strength in each part of the Schottky barrier diode 3 increases. The donor concentration in the n-type semiconductor layer 31 is preferably not more than about $2.0 \times 10^{17}$ cm$^{-3}$ to lower the maximum electric field strength in a region of the n-type semiconductor layer 31 immediately under the anode electrode 33 and the maximum electric field strength in the n-type semiconductor layer 31. On the other hand, as the donor concentration decreases, resistance of the n-type semiconductor layer 31 increases and the forward loss increases. Therefore, to obtain withstand voltage of, e.g., not more than 1200V, the donor concentration is preferably not less than $6.0 \times 10^{15}$ cm$^{-3}$. To obtain higher withstand voltage, the donor concentration may be reduced to, e.g., about $1.0 \times 10^{15}$ cm$^{-3}$.

As the thickness of the n-type semiconductor layer 31 increases, the maximum electric field strength in the n-type semiconductor layer 31 decreases. By adjusting the thickness of the n-type semiconductor layer 31 to not less than about 3 µm, it is possible to effectively reduce the maximum electric field strength in the n-type semiconductor layer 31. In view of reduction in these electric field strengths and downsizing of the Schottky barrier diode 3, the thickness of the n-type semiconductor layer 31 is preferably about not less than 3 µm and not more than 15 µm.

The p-type semiconductor layer 32 is formed of a p-type semiconductor in which the volume of amorphous portion is higher than the volume of crystalline portion. NiO, SnO and Cu$_2$O exhibit p-type conductivity without being doped with any dopant, but may contain an acceptor impurity such as Li.

Among NiO, SnO and Cu$_2$O, NiO is the most preferable material for the p-type semiconductor layer 32 since NiO is thermodynamically stable and allows p-type layers to be stably obtained. It is difficult to form SnO due to the existence of Sn$_2$O which is thermodynamically more stable than SnO. In this regard, the conductivity of Sn$_2$O is unstable and it is difficult to control to be p-type. The conductivity of Cu$_2$O is also unstable and it is difficult to control to be p-type.

A p-type semiconductor film containing an amorphous portion can be formed at a lower temperature than an entirely crystalline p-type semiconductor film, and thus can be manufactured easier at lower cost. Particularly, it is difficult to bury the crystalline p-type semiconductor film since surfaces of the Ga$_2$O$_3$-based single crystal with various orientations are exposed on the inner surfaces of the trenches 35, but it is relatively easy to bury the p-type semiconductor film containing an amorphous portion. In addition, by using the p-type semiconductor film containing an amorphous portion as the p-type semiconductor layer 32, occurrence of leakage current can be suppressed as compared to when using the entirely crystalline p-type semiconductor film.

The anode electrode 33 is configured so that a portion in contact with the n-type semiconductor layer 31 is formed of a material to be in Schottky contact with the n-type semiconductor layer 31. In detail, the anode electrode 33 when having a single layer structure is entirely formed of a material to be in Schottky contact with the n-type semiconductor layer 31, and the anode electrode 33 when having a multilayer structure is configured so that at least a layer in contact with the n-type semiconductor layer 31 is formed of a material to be in Schottky contact with the n-type semiconductor layer 31.

To reduce the turn-on voltage of the Schottky barrier diode 3, a portion of the anode electrode 33 in contact with the n-type semiconductor layer 31 is preferably formed of Fe (iron), Cu (copper), Mo (molybdenum) or W (tungsten).

When the portion of the anode electrode 33 in contact with the n-type semiconductor layer 31 is formed of Mo or W, the turn-on voltage of the Schottky barrier diode 3 is not less than 0.4V and not more than 0.6V. When the portion of the anode electrode 33 in contact with the n-type semiconductor layer 31 is formed of Fe, the turn-on voltage of the Schottky barrier diode 3 is not less than 0.4V and not more than 0.7V. When the portion of the anode electrode 33 in contact with the n-type semiconductor layer 31 is formed of Cu, the turn-on voltage of the Schottky barrier diode 3 is not less than 0.6V and not more than 0.9V.

The cathode electrode 34 is in ohmic contact with the n-type semiconductor substrate 30. The cathode electrode 34 is formed of a metal such as Ti. The cathode electrode 34 may have a multilayer structure formed by stacking different metal films, e.g., Ti/Au or Ti/Al. For reliable ohmic contact between the cathode electrode 34 and the n-type semiconductor substrate 30, the cathode electrode 34 is preferably configured such that a layer in contact with the n-type semiconductor substrate 30 is formed of Ti.

Effects of the Embodiment

In the first to third embodiments, it is possible to provide the pn junction diode 1, the trench JBS diode 2 and the Schottky barrier diode 3 with a guard ring structure which are Ga$_2$O$_3$-based diodes utilizing a pn heterojunction and can be easily produced at low cost.

Example 1

In Example 1, the pn junction diode 1 in the first embodiment was made and its forward and reverse characteristics were measured.

In Example 1, an n-type Ga$_2$O$_3$ substrate formed by the EFG method, containing Sn as a donor at a donor concentration of about $10^{18}$ cm$^{-3}$ and having a thickness of about 600 µm and principal plane orientation of (001) was used as the n-type semiconductor substrate 10.

Meanwhile, an n-type Ga$_2$O$_3$ film grown by the HYPE method, containing Si as a donor at a donor concentration of about $6 \times 10^{16}$ cm$^{-3}$ and having a thickness of about 3.2 µm was used as the n-type semiconductor layer 11.

Then, an undoped p-type NiO film (with no intentionally doped donor) formed by radio-frequency sputtering and having a thickness of about 100 nm was used as the p-type semiconductor layer 12. The radio-frequency sputtering conditions were substrate temperature of 300° C., plasma output of 50 W, pressure of 0.35 Pa, $O_2$ as gas species, gas flow rate of 10 sccm, 99.5% purity NiO as a target, and deposition time of 1 hour.

In addition, a circular Ni electrode having a diameter of 200 μm was formed as the anode electrode 13 by electron beam evaporation.

Then, an electrode having a Ti/Au stacked structure was formed as the cathode electrode 14 on the entire back surface of the n-type semiconductor substrate 10 by electron beam evaporation. After forming the anode electrode 13 and the cathode electrode 14, dry etching was performed using the anode electrode 13 as a mask, and a portion of the n-type semiconductor layer 11 on the upper side and the p-type semiconductor layer 12 were patterned into a mesa shape as shown in FIG. 1.

Figure 6A:
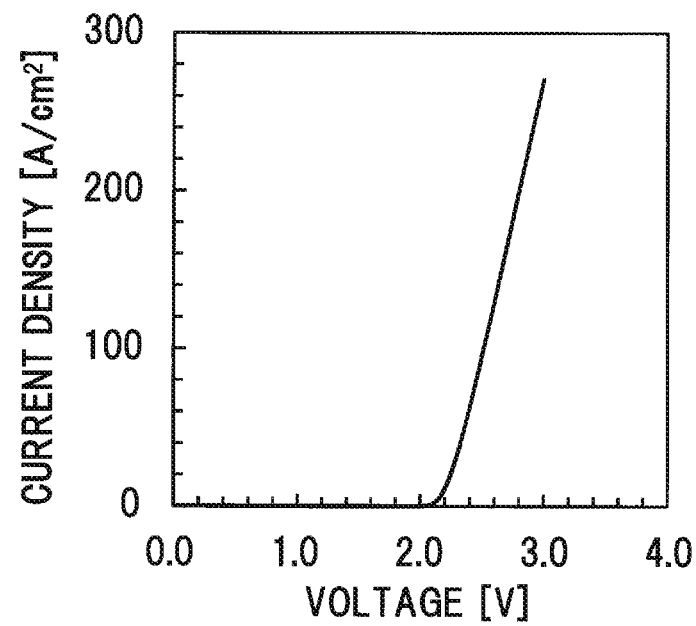
FIG. 6A is a graph showing forward characteristics of a pn junction diode in Example 1.
Figure 6B:
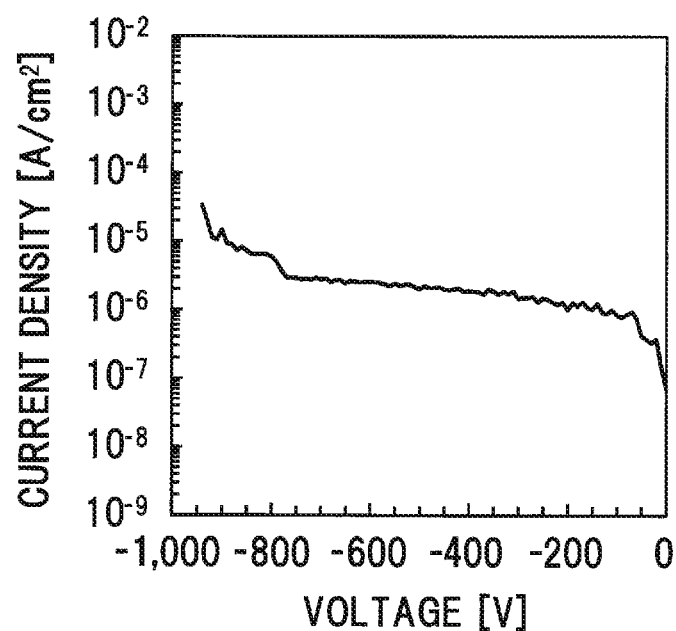
FIG. 6B is a graph showing reverse characteristics of the pn junction diode in Example 1.

FIGS. 6A and 6B are graphs respectively showing forward characteristics and reverse characteristics of the pn junction diode 1 in Example 1.

Based on FIGS. 6A and 6B, the pn junction diode 1 in Example 1 operates properly as a pn junction diode. This shows that a pn junction is formed between the n-type semiconductor layer 11 as an n-type $Ga_2O_3$ film and the p-type semiconductor layer 12 as a p-type NiO film.

Example 2

In Example 2, dependence of characteristics of NiO film on film formation conditions was examined.

In Example 2, NiO films were formed by radio-frequency sputtering. The radio-frequency sputtering conditions were substrate temperature of 25 to 400° C., plasma output of 50 to 300 W, pressure of 0.35 Pa, $O_2$ as gas species, gas flow rate of 10 sccm, NiO as a target, and deposition time of 1 hour.

Figure 7A:
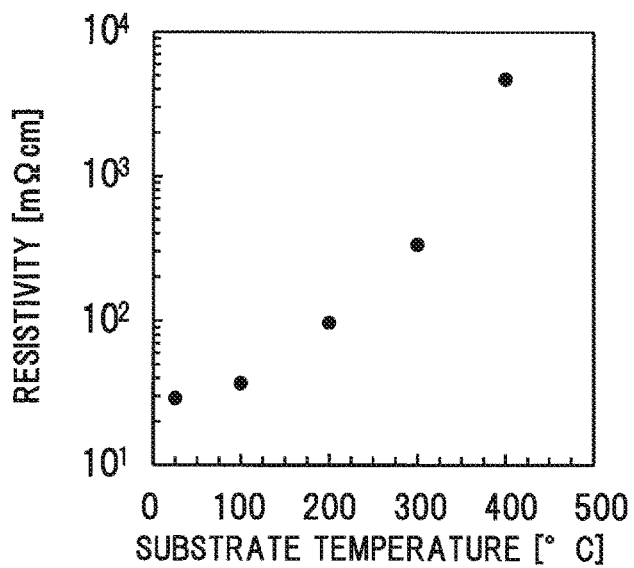
FIG. 7A is a graph showing dependence of resistivity of NiO film on substrate temperature in Example 2.

FIG. 7A is a graph showing dependence of resistivity of the NiO film on substrate temperature in Example 2. The NiO films pertaining to FIG. 7A were formed with a fixed plasma output of 300 W.

FIG. 7A shows that the lower the substrate temperature, the lower the resistivity of the NiO film. Based on this result, the substrate temperature when forming the NiO film by radio-frequency sputtering is preferably not less than 25° C. and not more than 400° C. to reduce the resistivity. However, this is the result when using an undoped NiO target, and it is possible to obtain a low-resistivity film at a temperature of more than 400° C. by doping of an acceptor.

Figure 7B:
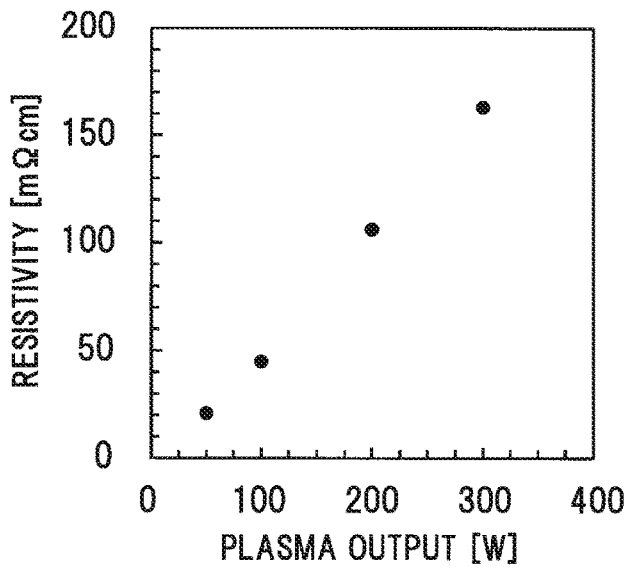
FIG. 7B is a graph showing dependence of resistivity of NiO film on plasma output in Example 2.

FIG. 7B is a graph showing dependence of resistivity of the NiO film on plasma output in Example 2. The NiO films pertaining to FIG. 7B were formed with a fixed substrate temperature of 200° C.

FIG. 7B shows that the lower the plasma output, the lower the resistivity of the NiO film. Based on this result, the plasma output when forming the NiO film by radio-frequency sputtering is preferably not less than 50 W and not more than 300 W to reduce the resistivity.

Figure 7C:
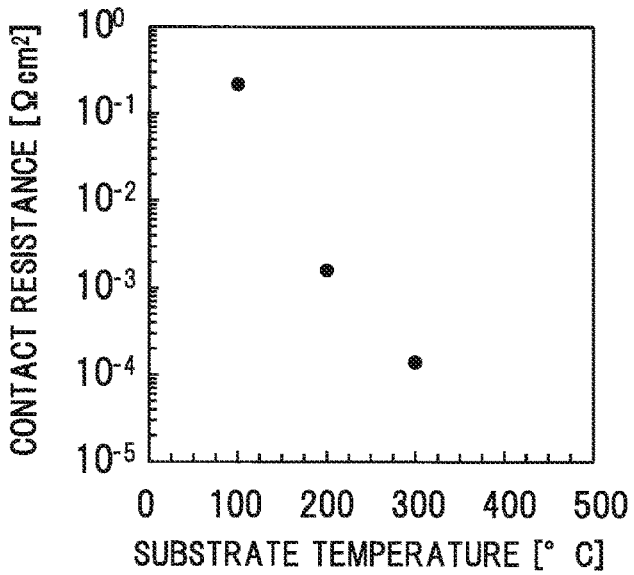
FIG. 7C is a graph showing dependence of contact resistance between NiO film and Pt electrode on substrate temperature in Example 2.

FIG. 7C is a graph showing dependence of contact resistance between the NiO film and a Pt electrode on substrate temperature in Example 2. The NiO films pertaining to FIG. 7C were formed with a fixed plasma output of 300 W.

FIG. 7C shows that the higher the substrate temperature, the lower the contact resistance. Based on this result, the substrate temperature when forming the NiO film by radio-frequency sputtering is preferably not less than 100° C. to reduce the contact resistance with the electrode.

Example 3

In Example 3, characteristics of the anode electrode of Schottky barrier diode when using various electrode materials were examined.

Figure 8:
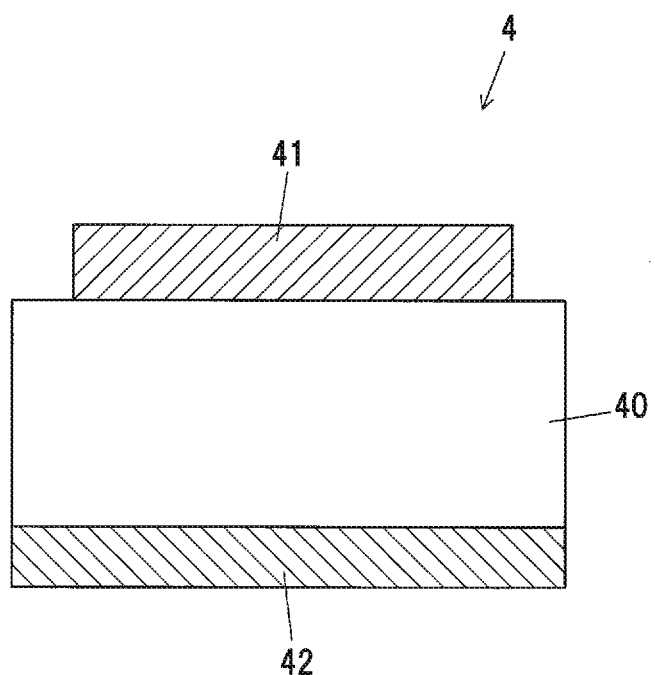
FIG. 8 is a vertical cross-sectional view showing a Schottky barrier diode in Example 3.

FIG. 8 is a vertical cross-sectional view showing a Schottky barrier diode 4 in Example 3. The Schottky barrier diode 4 is provided with a semiconductor substrate 40, an anode electrode 41 which is connected to one surface of the semiconductor substrate 40 and forms a Schottky junction with the semiconductor substrate 40, and a cathode electrode 42 which is connected to the other surface of the semiconductor substrate 40 and forms an ohmic junction with the semiconductor substrate 40.

An undoped $Ga_2O_3$ substrate having a donor concentration of about $10^{17}$ cm$^{-3}$ and a thickness of about 650 μm was used as the semiconductor substrate 40.

Then, a circular electrode having a diameter of 200 μm was formed as the anode electrode 41 by electron beam evaporation. Before depositing the anode electrode 41, the surface of the semiconductor substrate 40 was treated with a sulfuric acid/hydrogen peroxide mixture. Al, Ti, Mo, W, Fe, Cu, Ni, Pt and Pd were used as the material of the anode electrode 41.

Then, an electrode having a Ti/Au stacked structure formed by stacking a 50 nm-thick Ti film and a 200 nm-thick Au film was formed as the cathode electrode 42 on a portion of the back surface of the semiconductor substrate 40 by electron beam evaporation.

Figure 9:
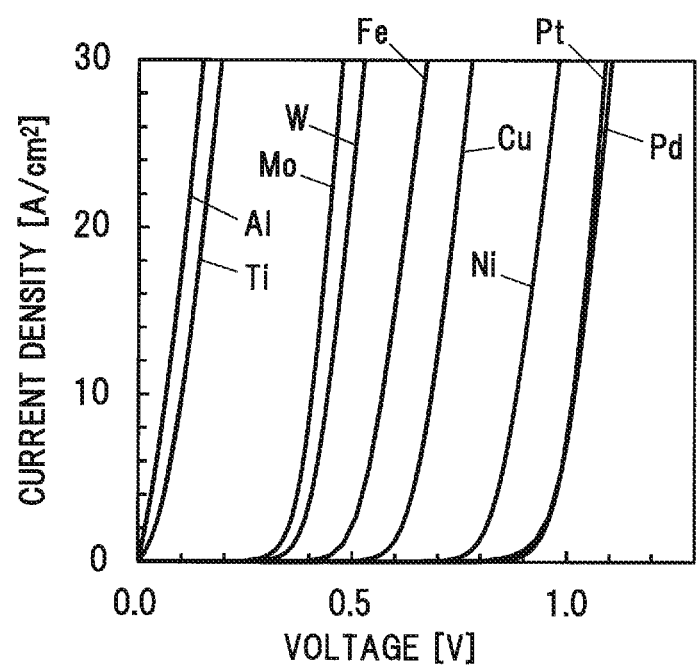
FIG. 9 is a graph showing forward characteristics of the Schottky barrier diode in Example 3.

FIG. 9 is a graph showing forward characteristics of the Schottky barrier diodes 4 in Example 3.

FIG. 9 shows that the turn-on voltages of the Schottky barrier diodes, when the anode electrode material is Al, Ti, Mo, W, Fe, Cu, Ni, Pt and Pd, are respectively about 0V, 0.05V, 0.35V, 0.4V, 0.55V, 0.65V, 0.85V, 0.95V and 0.95V.

Of those materials, Fe, Cu, Mo and W when used as an electrode material provide turn-on voltages between those obtained when using Ti and Ni which are well-known conventional anode materials. Thus, Fe, Cu, Mo and W are usable as new Schottky electrode materials.

Although Ag is a material providing a lower turn-on voltage than Fe, Cu, Mo and W, several experiments confirmed that its repeatability and reproducibility of turn-on voltage is very low and Ag is not suitable as an electrode material for Schottky barrier diode.

Example 4

In Example 4, the trench JBS diode 2 in the second embodiment was made and its characteristics were evaluated.

In Example 4, an n-type $Ga_2O_3$ substrate formed by the EFG method, containing Sn as a donor at a donor concentration of about $2.5\times10^{18}$ cm$^{-3}$ and having a thickness of about 350 μm and principal plane orientation of (001) was used as the n-type semiconductor substrate 20.

Meanwhile, an n-type $Ga_2O_3$ film grown by the HYPE method, containing Si as a donor at a donor concentration of about $6\times10^{16}$ cm$^{-3}$ and having a thickness of about 6.5 μm was used as the n-type semiconductor layer 21.

The n-type semiconductor layer 21 was configured such that the trenches 25 had the depth $D_t$ of about 2 μm and the width $W_t$ of about 4.8 μm, and the mesa-shaped portion had the width $W_m$ of about 1.2 μm.

An electrode having a Ti/Au stacked structure was formed as the cathode electrode 24 on the entire back surface of the n-type semiconductor substrate 20 by electron beam evaporation. After forming the cathode electrode 24, heat treatment was performed in a nitrogen atmosphere at 450° C. for 1 minute to reduce contact resistance between the cathode electrode 24 and the n-type semiconductor substrate 20.

Then, an undoped p-type NiO film formed by radio-frequency sputtering was used as the p-type semiconductor layers 22. The radio-frequency sputtering conditions were substrate temperature of 200° C., plasma output of 300 W, pressure of 0.35 Pa, $O_2$ as gas species, gas flow rate of 10 sccm, NiO as a target, and deposition time of 4 hours, and a NiO film having a thickness of about 3 μm was formed. A portion of the NiO film outside the trenches 25 was removed by CMP.

In addition, a 300 μm-diameter circular electrode having a Mo/Au stacked structure, etc., was formed as the anode electrode 23 by electron beam evaporation and lift-off.

Figure 10A:
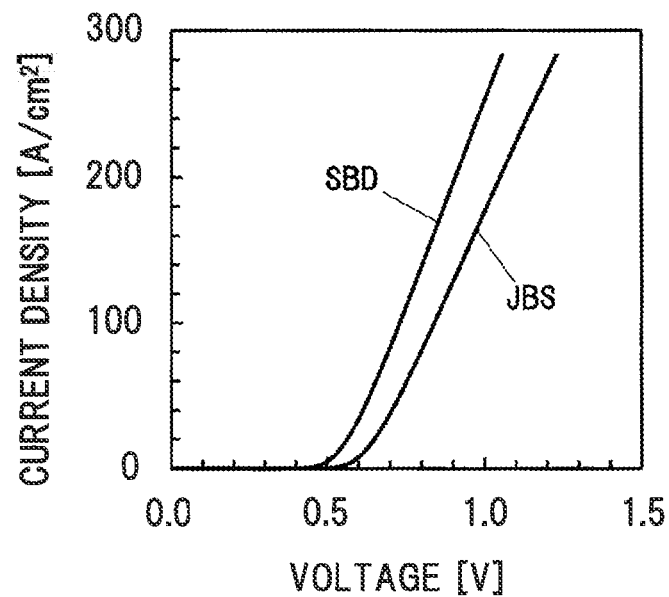
FIG. 10A is a graph showing forward characteristics of a trench JBS diode in Example 4.
Figure 10B:
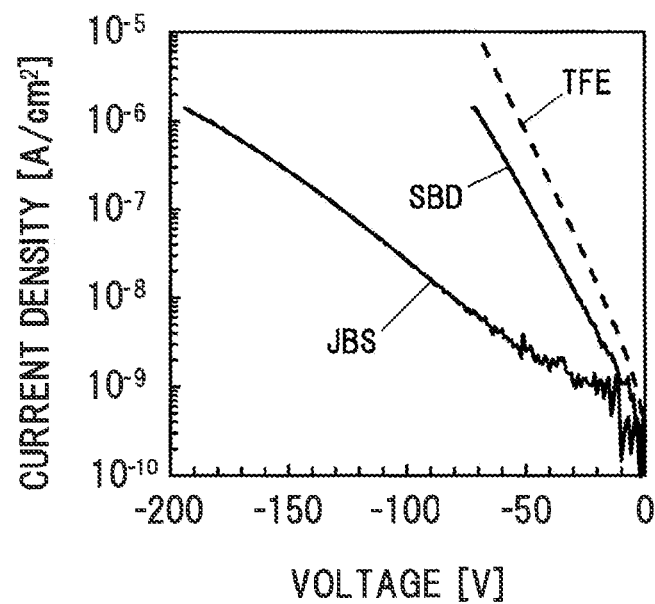
FIG. 10B is a graph showing reverse characteristics of the trench JBS diode in Example 4.

FIGS. 10A and 10B are graphs respectively showing forward characteristics and reverse characteristics of the trench JBS diode 2 in Example 4.

In FIGS. 10A and 10B, "JBS" indicates the characteristics of the trench JBS diode 2, and "SBD" indicates the characteristics of a normal Schottky barrier diode as Comparative Example which does not have the JBS structure. In addition, "TFE" in FIG. 10B is a calculation result based on thermionic-field emission theory (calculated using a potential barrier height of 0.8 eV and a donor concentration of $6\times10^{16}$ $cm^{-3}$ in a semiconductor which forms a Schottky junction with a Schottky electrode).

Based on FIGS. 10A and 10B, the trench JBS diode 2 in Example 4 operates properly as a Schottky barrier diode. This shows that a pn junction is formed between the n-type semiconductor layer 21 as an n-type $Ga_2O_3$ film and the p-type semiconductor layer 22 as a p-type NiO film.

In addition, based on FIG. 10B, while the normal Schottky barrier diode not having the JBS structure has a very large leakage current which is close to the thermionic-field emission theory, the leakage current of the trench JBS diode 2 is several orders of magnitude smaller than the normal Schottky barrier diode. This is because electric field strength at Schottky junction was reduced by providing the JBS structure and leakage current due to thermionic-field emission (TFE) was suppressed.

If a crystalline NiO film is used in place of the p-type semiconductor layer 22 formed of NiO in which the volume of amorphous portion is higher than the volume of crystalline portion, leakage characteristics to be obtained may be worse than the leakage characteristics according to the thermionic-field emission theory.

Although the embodiments and Examples of the invention have been described, the invention is not intended to be limited to the embodiments and Examples, and the various kinds of modifications can be implemented without departing from the gist of the invention.

In addition, the invention according to claims is not to be limited to the embodiments and Examples described above. Further, it should be noted that all combinations of the features described in the embodiments and Examples are not necessary to solve the problem of the invention.

INDUSTRIAL APPLICABILITY

Provided is a $Ga_2O_3$-based diode utilizing a pn heterojunction, which can be easily produced at low cost.

REFERENCE SIGNS LIST 1 pn JUNCTION DIODE
2 TRENCH JBS DIODE
3 SCHOTTKY BARRIER DIODE
10, 20, 30 n-TYPE SEMICONDUCTOR SUBSTRATE
11, 21, 31 n-TYPE SEMICONDUCTOR LAYER
12, 22, 32 p-TYPE SEMICONDUCTOR LAYER
13, 23, 33 ANODE ELECTRODE
14, 24, 34 CATHODE ELECTRODE
25, 35 TRENCHES

The invention claimed is:

1. A diode having a rectification property of allowing current to pass only in a direction from an anode electrode toward a cathode electrode, comprising:
an n-type semiconductor substrate comprising an n-type $Ga_2O_3$-based single crystal;
an n-type semiconductor layer comprising an n-type $Ga_2O_3$-based single crystal and formed on a surface of the n-type semiconductor substrate;
a p-type semiconductor layer comprising NiO as a p-type semiconductor in which a volume of an amorphous portion is higher than a volume of a crystalline portion and in contact with the n-type semiconductor layer;
the anode electrode in ohmic contact with the p-type semiconductor layer; and
the cathode electrode in ohmic contact with a surface of the n-type semiconductor substrate opposite to the n-type semiconductor layer,
wherein the n-type semiconductor layer and the p-type semiconductor layer form a pn heterojunction, and
wherein the p-type semiconductor layer is buried in trenches formed on a surface of the n-type semiconductor layer opposite to the n-type semiconductor substrate.

2. The diode according to claim 1, wherein the rectification property of the diode is provided by the pn heterojunction.

3. The diode according to claim 1, wherein the anode electrode is further in Schottky contact with the n-type semiconductor layer and forms a Schottky junction with the n-type semiconductor layer, and wherein the rectification property of the diode is provided by the Schottky junction.

4. The diode according to claim 3, wherein the diode has a trench junction barrier Schottky structure or a guard ring structure, and wherein the anode electrode is formed on the surface of the n-type semiconductor layer so as to be in contact with the n-type semiconductor layer and the p-type semiconductor layer.

5. The diode according to claim 3, wherein a portion of the anode electrode in contact with the n-type semiconductor layer comprises Fe, Cu, Mo or W.

6. The diode according to claim 4, wherein a portion of the anode electrode in contact with the n-type semiconductor layer comprises Fe, Cu, Mo or W.

* * * * *